United States Patent
Ja et al.

(10) Patent No.: US 7,046,182 B1
(45) Date of Patent: May 16, 2006

(54) DAC HAVING SWITCHABLE CURRENT SOURCES AND RESISTOR STRING

(75) Inventors: Kaushal Kumar Ja, Bangalore (IN); Arindam Raychaudhuri, Bangalore (IN); Michael T. Tuthill, Raheen Cross (IE); William Hunt, Castletroy (IE); David A. Phelan, Raheen (IE); Colin G. Lyden, Baltimore (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/925,748

(22) Filed: Aug. 25, 2004

Related U.S. Application Data

(60) Provisional application No. 60/507,900, filed on Oct. 1, 2003, provisional application No. 60/509,738, filed on Oct. 8, 2003.

(51) Int. Cl.
*H03M 1/66* (2006.01)
(52) U.S. Cl. ...................... 341/144; 341/154
(58) Field of Classification Search ........... 341/144, 341/154, 141
See application file for complete search history.

(56) References Cited

U.S. PATENT DOCUMENTS

| | | | | |
|---|---|---|---|---|
| 3,699,568 A * | 10/1972 | Thompson et al. | ......... | 341/153 |
| 5,612,696 A * | 3/1997 | Kim | ............. | 341/136 |
| 5,726,652 A * | 3/1998 | Giuroiu | ............. | 341/154 |
| 5,943,000 A * | 8/1999 | Nessi et al. | ......... | 341/154 |
| 6,225,929 B1 * | 5/2001 | Beck | ............. | 341/144 |
| 6,683,549 B1 * | 1/2004 | Kinugasa | ............. | 341/136 |

* cited by examiner

*Primary Examiner*—Peguy JeanPierre
(74) *Attorney, Agent, or Firm*—Wolf, Greenfield & Sacks, P.C.

(57) ABSTRACT

A DAC architecture is provided which is monotonic in operation despite any mismatches in the components. The architecture is a segmented architecture and hence it is area efficient. This is achieved by effecting a generation of analog voltages by driving current sources to resistors in response to digital input. In a preferred embodiment, the invention provides a resistor string coupled between output and vref-, and set of current sources. The current sources are switched to nodes between resistors to generate voltages at the output.

18 Claims, 3 Drawing Sheets

DAC HAVING SWITCHABLE CURRENT SOURCES AND RESISTOR STRING

FIELD OF THE INVENTION

The present invention relates to digital to analog converters (DAC's) and in particular to a segmented DAC architecture adapted to provide for monotonicity irrespective of mismatches in the components making up the DAC.

BACKGROUND OF THE INVENTION

A DAC having a segmented structure typically operates by dividing a digital input word into subwords which control different parts of the DAC circuit. For example, a digital input word might be divided into a more significant (MS) subword and a less significant (LS) subword, the MS subword being used to generate a first intermediate current or voltage signal that is summed with a second intermediate voltage or current signal generated responsive to the LS subword. Such segmented architectures are particularly useful for reducing the number of resistive elements required to provide a resistive DAC with high resolution. However, summing the intermediate signals without buffering the outputs of the signal generating circuits may subject the outputs of the signal generating circuits to excessive load conditions. On the other hand, adding such buffering to the output of each signal generating circuit typically introduces noise and adds to the cost and complexity of the DAC.

U.S. Pat. No. 6,225,929 describes a DAC architecture which switches currents to binary weighted resistors. This architecture is specifically adapted to tackle the problems associated with buffering highlighted above. The static DAC design of this US patent is adapted for converting an N bit input digital word to a corresponding analog output. This is achieved by providing a resistor string having N resistors and coupling each of N switchable current sources to a corresponding one of N nodes of the resistor string. This DAC is useful for high resolution general purpose applications but suffers in that it is not suitable in applications that require monotonic behaviour.

This problem of monotonicity arises from the transfer function of the DAC. Monotonicity is vital in many applications such as in control systems where non-monotonic DACs can create serious problem. In many practical cases, however, due to unavoidable component inaccuracies in the DACs, monotonicity is not always guaranteed.

In view of the foregoing, it is desirable to provide a segmented DAC which is simple to implement, and which provides immunity to loading problems associated with unbuffered analog summing of intermediate signals. It would further be desirable to provide a segmented DAC which does not require a separate buffer circuit between the output of each signal generating circuit and the summing circuitry of the DAC. It would also be desirable to provide monotonic transfer function of the DAC.

SUMMARY OF THE INVENTION

These and other problems associated with the prior art are obviated by a DAC in accordance with the present invention, which provides guaranteed monotonic behaviour, one of the most desired requirements of any DAC. It is monotonic in spite of any mismatches in the components. The architecture is also segmented and hence it is area efficient for the resolution achievable. This is achieved by effecting a generation of analog voltages by driving current sources to resistors in response to digital input. In a preferred embodiment, the invention provides a resistor string coupled between an output node and a voltage reference node (vref-), and set of current sources. The current sources are switched to nodes in the resistor string which in turn generates a voltage at the output. One of the major advantages of this architecture is that very small size switches may be used and hence the architecture is area efficient.

In accordance with a first embodiment of the invention a digital to analog converter (DAC) is provided which is adapted to convert a digital input word having N bits to a corresponding analog voltage output signal, the DAC comprising:

a current array including a plurality of current sources and having $2^L$ outputs, a set of switches individually coupled to the $2^L$ outputs from the current sources, a resistor string having $2^M$ resistors, the resistors being serially coupled between a reference voltage and the voltage output and being switchably coupled via the set of switches to the current string, and wherein the number M of current sources and number L of resistors when summed are equal to the number N of bits of the input digital word.

The invention also provides a digital to analog converter (DAC) adapted to convert a digital input word having N bits to a corresponding analog voltage output signal, the DAC comprising:

a first segment having a plurality of current sources, and a plurality of outputs therefrom, a resistor string having a plurality of resistors, the resistors being serially coupled between a reference voltage and the voltage output a set of switches individually coupling the outputs of the first segment to the resistors in the resistor string, and wherein, in use, the number of outputs from the first segment switched to the number of resistors is equal to $2^L$ and the number of resistors in the string is equal to $2^M$, where N=M+L.

The set of switches desirably comprises $2^N$ individual switches, although in certain embodiments less than $2^N$ individual switches are provided.

The architecture of the DAC of the present invention is such that desirably an increment in a digital word applied to the input of the DAC requires the addition of at least one resistor or current source to generate the corresponding incremental output analog voltage, thereby providing a monotonic response.

In certain embodiments, the individual current sources may be selectively cycled to alternative input nodes within the resistor string, thereby reducing the effect of mismatch between the individual current sources.

The voltage output of the DAC may be coupled to a low impedance node, such that the current into the low impedance node will increase monotonically with the DAC input code.

Such a low impedance node may be provided by a virtual ground of an operational amplifier, the operational amplifier being configured as a current to voltage converter The invention also provides a digital to analog converter (DAC) adapted for converting a N-bit digital input word to a corresponding analog voltage output, the DAC comprising:

a resistor string comprising a plurality of resistors serially connected together, the resistor string having an output node, and a reference node connected to a reference voltage, a plurality of current sources, a switching arrangement for selectively connecting the individual current sources to input nodes in the resistor string to produce an analog output voltage at the output node, and wherein at least one of the individual current sources may be selectively switched by the switching arrangement to more than one input node such that a reduction is achieved in the required number of resistors and current sources. The invention also provides a method of providing a monotonic DAC adapted to convert an N-bit digital word applied to an input thereof to a corresponding analog voltage at an output thereof, the method comprising the steps of:

Providing a first segment including a plurality of current sources and having a plurality of inputs, providing a second segment having a plurality of inputs and including a set of resistors serially connected between a reference voltage and the output node of the DAC, switchably coupling the outputs of the first segment to the inputs of the second segment in response to the applied digital word at the input of the DAC, and wherein the outputs from the first segment can be changeably coupled to differing inputs of the second segment.

These and other features of the present invention will be better understood with reference to the following drawings.

DETAILED DESCRIPTION OF THE DRAWINGS

Figure 1:
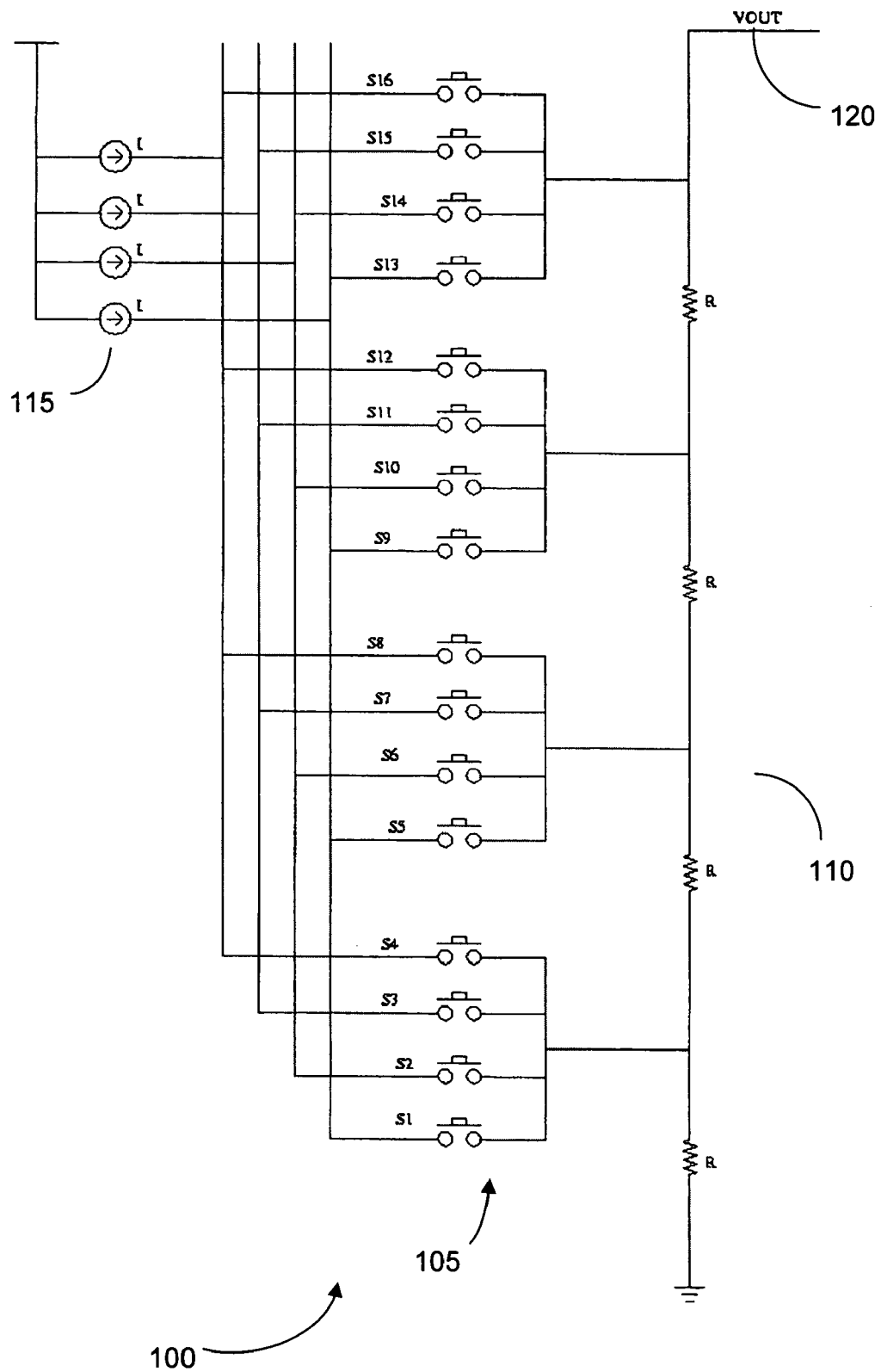
FIG. 1 is a schematic showing a DAC configuration in accordance with the present invention.

FIG. 1 is an example of a DAC architecture in accordance with the present invention, implemented as a 4 bit DAC. It will be appreciated that this specific illustration of the number of bits is exemplary of the type of application with which the architecture may be used and that it is not intended to limit the present invention to any one specific application, as the methodology and architecture of the present invention may be extended to any number of bits. In this embodiment of the 4 bit architecture, two blocks are provided. A first block is provided by a current array 115 including a plurality of current sources and having a plurality of outputs therefrom. A second block is provided by a resistor array 110, illustrated in FIG. 1 as a string of individual resistors serially connected together, the resistor string having a plurality of intermediate nodes nodes and an output node corresponding to the voltage output of the DAC, and a reference node connected to a reference voltage, typically ground. The first block is coupled to the second block via a set of switches 105, with the outputs from the current block coupled to more than one switch within the switch array. According to the present invention individual current sources within the current block may be selectively switched to one or more of the input nodes (the input nodes comprise the intermediate nodes and the output node, and in certain arrangements the reference node) to the resistor string. It will be appreciated that whilst each resistor in the string has the same nominal resistance value, the actual resistance values may vary slightly.

It is to be noted that it the exemplary DAC architecture of FIG. 1 is segmented in the sense that number of resistors and current sources are four each for 4-bit DAC. This may be generalized, for a N-bit DAC in accordance with the present invention, that, in use, the number of current outputs originating from the first block switched to the number of resistors is equal to $2^L$ and the number of resistors in the string is equal to $2^M$, where N=M+L. For other reasons, including those of redundancy or linearisation, the actual numbers provided in the architecture of these components may be greater, but that at any given time the effective limits or numbers will not be exceeded.

It will be further understood that the current and resistor architectures illustrated in FIG. 1 are exemplary of the type of architectures that may be provided. Other replacement configurations may equally be used without departing from the spirit and scope of the present invention. An example of a replacement architecture that my be used in the current segment of FIG. 1 is given in co-pending, co-assigned and concurrently filed US application claiming priority from U.S. Provisional Application No. 60/507,914, the content of which is hereby incorporated by means of reference.

The value of the Current I and resistor R are desirably chosen in such a way that I*R=the voltage output corresponding to1 LSB In response to digital word of 0000, all switches 105 will remain open and output voltage at the voltage output node VOUT will be equal to zero. In response to digital word of 0001, switch S1 is closed and the other switches left open. So current I flows through R and the output voltage ($V_{out}$) is equal to 1 LSB. The following table will illustrate the remaining digital codes.

TABLE 1

| Digital Word | Closed Switches | Output Voltage |
|---|---|---|
| 0000 | None | 0 |
| 0001 | S1 | 1LSB(= I*R) |
| 0010 | S5 | 2LSB(= I*2R) |
| 0011 | S9 | 3LSB(= I*3R) |
| 0100 | S13 | 4LSB(= I*4R) |
| 0101 | S13, S2 | 5LSB(= I*4R + I*R) |
| 0110 | S13, S6 | 6LSB(= I*4R + I*2R) |
| 0111 | S13, S10 | 7LSB(= I*4R + I*3R) |
| 1000 | S13, S14 | 8LSB(= I*4R + I*4R) |
| 1001 | S13, S14, S3 | 9SLB(= I*4R + I*4R + I*R) |
| 1010 | S13, S14, S7 | 10LSB(= I*4R + I*4R + I*2R) |
| 1011 | S13, S14, S11 | 11LSB(= I*4R + I*4R + I*3R) |
| 1100 | S13, S14, S15 | 12LSB(= I*4R + I*4R + I*4R) |
| 1101 | S13, S14, S15, S4 | 13LSB(= I*4R + I*4R + I*4R + I*R) |
| 1110 | S13, S14, S15, S8 | 14LSB(= I*4R + I*4R + I*4R + I*2R) |
| 1111 | S13, S14, S15, S12 | 15LSB(= I*4R + I*4R + I*4R + I*3R) |

So, from 0001-0100, 0110-1000, 1010-1100, 1110-111 with an increment in digital code, it will be seen that one additional resistor is added to generate higher voltage in response each increment in digital code. And at digital word of 0101, 1001 and 1101, an additional current source is added to generate higher voltage in response to the higher digital code. So for any increment in the digital word, either a resistor or current source is added to generate the higher voltage, so that the converter is always monotonic in spite of unavoidable inaccuracies in the resistors or current sources.

It will be appreciated that the effects of switch resistance are not very important and hence very small switches may be used. It will also be noted that the number of switches required to effect the operation of Table 1 is equal to $2^N$, if the circuit arrangement of FIG. 1 is adopted, which is very large for higher resolutions and for which the purpose of segmentation would be defeated. This problem may be solved by arrangement of switches shown in FIG. 2, the operation of which can be understood with reference to Table 2 below. The arrangement shown is for a 4-bit DAC but it will be appreciated that the arrangement may readily be extended to a DAC having any number of bits.

TABLE 2

| DIGITAL WORD | Closed Switches | Output Voltage |
|---|---|---|
| 0000 | S1, S4, S7, S10 | 0 |
| 0001 | S2, S13, S4, S7, S10 | 1LSB(= I*R) |
| 0010 | S2, S14, S4, S7, S10 | 2LSB(= I*2R) |
| 0011 | S2, S15, S4, S7, S10 | 3LSB(= I*3R) |
| 0100 | S3, S4, S7, S10 | 4LSB(= I*4R) |
| 0101 | S3, S5, S13, S7, S10 | 5LSB(= I*4R + I*R) |
| 0110 | S3, S5, S14, S7, S10 | 6LSB(= I*4R + I*2R) |
| 0111 | S3, S5, S15, S7, S10 | 7LSB(= I*4R + I*3R) |
| 1000 | S3, S6, S7, S10 | 8LSB(= I*4R + I*4R) |
| 1001 | S3, 56, S8, S13, S10 | 9SLB(= I*4R + I*4R + I*R) |
| 1010 | S3, 56, 58, 514, S10 | 10LSB(= I*4R + I*4R + I*2R) |
| 1011 | S3, S6, S8, S15, S10 | 11LSB(= I*4R + I*4R + I*3R) |
| 1100 | S3, S6, S9, S10 | 12LSB(= I*4R + I*4R + I*4R) |
| 1101 | S3, S6, S9, S11, S13 | 13LSB(= I*4R + I*4R + I*4R + I*R) |
| 1110 | S3, S6, S9, S11, S14 | 14LSB(= I*4R + I*4R + I*4R + I*2R) |
| 1111 | S3, S6, S9, S11, S15 | 15LSB(= I*4R + I*4R + I*4R + I*3R) |

Figure 2:
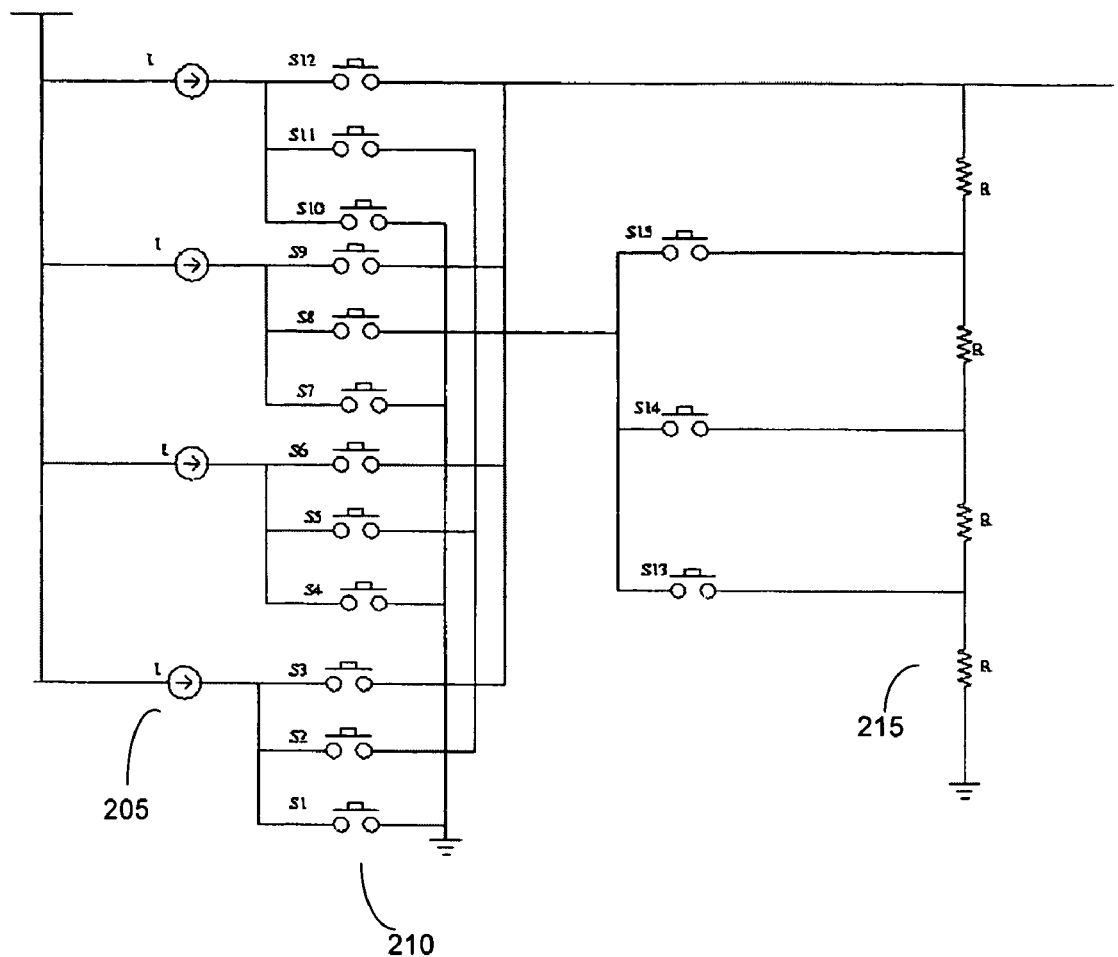
FIG. 2 is an example of an alternative DAC architecture in accordance with the present invention.

It will be noted from an examination of FIG. 2 that in the case of an N-bit DAC, where the number of current sources may be stated as $2^L$ and the number of resistors may be stated as $2^M$, such that N=L+M. As each current source will require three directly connected switches (two if no ground connection is required for unused switches) and that a further set of switches will facilitate connections to the intermediate nodes in the resistor string, the number of switches required may be stated as $3*2^L+2^M-1$. So it will be appreciated that there has been segmentation in number of switches also. It will be appreciated that the current sources may be switched to any node in the resistor string, including the output node, the intermediate nodes between individual resistors and the reference node (ground). As such, in the exemplary four bit DAC of FIG. 2, there is a general requirement for three switched connections (S12,S11,S10; S7,S8,S9;S4,S5,S6; S1, S2,S3) for each current source. One of these switched connections (S2,S5,S8,S11) connects to a further switching arrangement (S13;S14;S15) which in turn facilitates connections to intermediate nodes in the resistor string. It will be understood that the figure of three switched connections is not a limiting value as certain applications may not require the connection of current sources to ground S1, S4, S7, S10 when not in use.

Dynamic Element Matching

It will be appreciated that if the configuration of the current sources above is held constant for any given input code, then mismatch between those current sources will contribute directly to the integral nonlinearity of the overall DAC. The integral nonlinearity can be improved if the current sources are switched or cycled in a fashion that keeps the nominal voltage across the ladder constant, but varies the selection of individual current sources connected to the ladder. This has the effect of shaping the current source mismatch away from the frequencies of interest. Algorithms for controlling the switching are described in, for instance, the literature on sigma delta techniques, where they are known as dynamic element matching, mismatch noise shaping or bit shuffling, and will be apparent to those skilled in the art.

Current Output

Heretofore the present invention has been described with reference to a DAC operated in a voltage output mode. It will be appreciated that it can also be used for current output if the voltage output node at the top of the resistor ladder, labelled Vout, above is connected to a low impedance node. In this case, as in the case of a voltage output, using the above described switching sequences, the current into the low impedance node will increase monotonically with DAC input code. This is particularly useful if the low impedance node is the virtual ground of an amplifier configured as a current-to-voltage converter as shown in FIG. 3.

Figure 3:
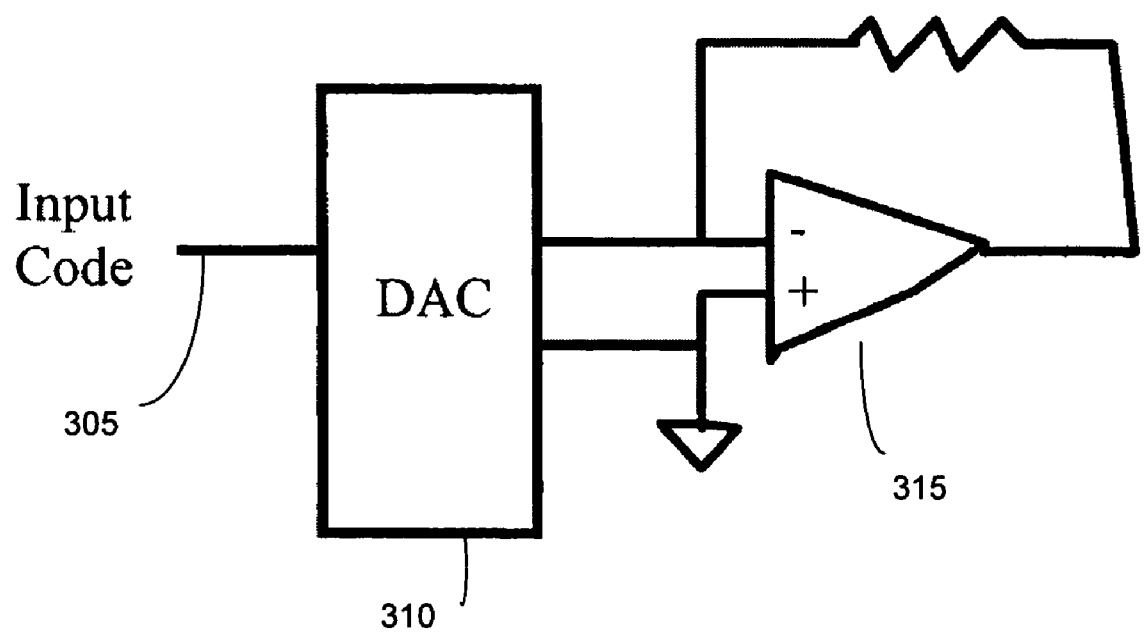
FIG. 3 is an example of an application of a DAC architecture of the present invention in a current output mode.

As shown in FIG. 3, an input control code 305 is fed to a DAC 310 according to the present invention. The outputs of the DAC (i.e. the output and reference nodes) are fed to an operational (op) amp 315, the reference node output to the non-inverting input and coupled to ground whereas the output node is connected to the inverting input of the op amp. The current output and current-to-voltage converter configurations offer a number of advantages. Firstly, the op amp has code independent input common mode voltage, in contrast to the voltage output mode where the op amp input common mode voltage varies greatly with input code. This makes the op amp easier to design. Secondly, the voltage range across the resistor ladder can be much less than the overall DAC output voltage swing, which makes the design of both the current sources and the resistor ladder switches easier.

Differential nonlinearity (DNL) is defined as the difference in output values of successive codes from the ideal value (equal to one Least Significant Bit (LSB)). The DNL error in LSBs terms for code n in a voltage output converter is given by:

$$DNL(n) = \frac{V_{out}(n) - V_{out}(n-1)}{1LSB} - 1 \quad \text{Equation 1}$$

As each of the incremental words is effected by adding an additional resistor from the string that the numerator is always going to be greater than 1. It will therefore be appreciated that the DNL performance of the DAC architecture of the present invention will provide a DNL which is inherently less than 1 LSB. Such behaviour is evidence of the monotonic performance of the DAC architecture.

It will be appreciated that the current sources of the present invention have been shown in schematic form and that any number of possible circuit components may be utilised to provide such current sources. Typical examples include one or more transistors.

It will also be appreciated that the present invention has been described with reference to preferred embodiments of the segmented DAC architecture in accordance with the present invention. By enabling a coupling of a plurality of current sources to more than one node in a resistor string the present invention is able to guaranteed monotonic behaviour. Therefore it will be understood that many modifications may be made to the illustrated exemplary embodiments of the present invention without departing from the spirit and scope of the present invention. It is not intended that the extent of protection provided by invention be limited in any way except as may be deemed necessary in the light of the appended claims.

The words comprises/comprising when used in this specification are to specify the presence of stated features, integers, steps or components but does not preclude the presence or addition of one or more other features, integers, steps, components or groups thereof.

The invention claimed is:

1. A digital to analog converter (DAC) adapted to convert a digital input word having N bits to a corresponding analog voltage output signal, the DAC comprising:
   a current array including a plurality of current sources and having $2^L$ outputs,
   a set of switches individually coupled to the $2^L$ outputs from the current sources,
   a resistor string having $2^M$ resistors, serially coupled between a reference voltage and the voltage output and the resistors being switchably coupled via the set of switches to the current array, and wherein the number M and number L when summed are equal to the number N of bits of the input digital word, wherein M and L are not equal to zero.

2. A digital to analog converter (DAC) adapted to convert a digital input word having N bits to a corresponding analog voltage output signal, the DAC comprising:
   a first block having a plurality of current sources, and a plurality of outputs therefrom,
   a resistor string having a plurality of resistors, serially coupled between a reference voltage and the voltage output,
   a set of switches individually coupling the outputs of the first block to the resistors in the resistor string, and wherein, in use, the number of outputs from the first block switched to the number of resistors is equal to $2^L$ and the number of resistors in the string is equal to $2^M$, where N=M+L, wherein M and L are not equal to zero.

3. The DAC of claim 2 wherein the set of switches comprises $2^N$ individual switches.

4. The DAC of claim 2 wherein the set of switches comprises less than $2^N$ individual switches.

5. The DAC of claim 2 configured such that an increment in the value of a digital word applied to the input of the DAC causes the addition of at least one resistor or current source to generate a corresponding incremental output analog voltage in a monotonic fashion.

6. The DAC of claim 2 wherein the individual current sources may be selectively cycled to alternative input nodes within the resistor string, thereby reducing the effect of mismatch between the individual current sources.

7. The DAC of claim 2 wherein the voltage output of the DAC is coupled to a low impedance node, such that current flow into the low impedance node will increase monotonically with the DAC input code.

8. The DAC of claim 7 wherein the low impedance node is provided by a virtual ground of an operational amplifier, the operational amplifier being configured as a current to voltage converter.

9. A digital to analog converter (DAC) adapted for converting a N-bit digital input word to a corresponding analog voltage output, the DAC comprising:
   a resistor string comprising a plurality of resistors serially connected together, the resistor string having an output node, and a reference node connected to a reference voltage,
   a plurality of current sources,
   a switching arrangement for selectively connecting the individual current sources to input nodes in the resistor string to produce an analog output voltage at the output node, and
   wherein at least one of the individual current sources may be selectively switched by the switching arrangement to more than one input node such that a reduction is achieved in the required number of resistors and current sources.

10. The DAC of claim 9 wherein the individual current sources may be cyclically switched to alternative input nodes within the resistor string, thereby reducing the effect of mismatch between the individual current sources.

11. The DAC of claim 9 wherein the voltage output of the DAC is coupled to a low impedance node, such that the current into the low impedance node will increase monotonically with the DAC input code.

12. The DAC of claim 11 wherein the low impedance node is provided by means of a virtual ground at the input of an operational amplifier, the operational amplifier being configured as a current to voltage converter.

13. The DAC as claimed in claim 9 wherein the plurality of current sources provided is greater in number than the current sources used at any one instant.

14. The DAC as claimed in claim 9 when used as a sub-DAC.

15. A method of providing a monotonic DAC adapted to convert an N-bit digital word applied to an input thereof to a corresponding analog voltage at an output thereof, the method comprising the steps of:
   providing a first segment including a plurality of current sources and having a plurality of inputs,
   providing a second segment having a plurality of inputs and including a set of resistors serially connected between a reference voltage and the output node of the DAC,
   switchably coupling the outputs of the first segment to the inputs of the second segment in response to the applied digital word at the input of the DAC, and wherein the outputs from the first segment can be changeably coupled to differing inputs of the second segment.

16. A digital to analog converter (DAC) adapted for converting an N-bit digital input word to a corresponding analog voltage output, the DAC comprising:
   a resistor string comprising a plurality of resistors serially connected together, each resistor in the string having the same nominal resistance value, the resistor string having an output node, intermediate nodes and a reference node connected to a reference voltage,
   a plurality of current sources,
   a switching arrangement for selectively connecting current sources to nodes in the resistor string to effect an analog output voltage at the output node, whereby the switching arrangement is configured to switch individual current sources to each of the intermediate nodes in the resistor string.

17. A DAC according to claim 16, wherein the switching arrangement comprises a first set of switches and a second set of switches, wherein the first set of switches is configured to connect individual current sources to the output node or to the second set of switches and the second set of switches is configured for switching to intermediate nodes in the resistor string.

18. A DAC according to claim 17, whereby the switching arrangement is configured such that in use only one current source is connectable to the second set of switches at a time.

* * * * *

UNITED STATES PATENT AND TRADEMARK OFFICE
CERTIFICATE OF CORRECTION

| | | |
|---|---|---|
| PATENT NO. | : 7,046,182 B1 | Page 1 of 1 |
| APPLICATION NO. | : 10/925748 | |
| DATED | : May 16, 2006 | |
| INVENTOR(S) | : Kaushal Kumar Jha et al. | |

It is certified that error appears in the above-identified patent and that said Letters Patent is hereby corrected as shown below:

Title Page, Item (12)
Delete "Ja et al." and insert --Jha et al.--.

\*\*On the title page, Item (75) Inventors: please change the name of the first inventor from "Kaushal Kumar Ja" to --Kaushal Kumar Jha--\*\* and Signed and Sealed this First Day of May, 2007

JON W. DUDAS
*Director of the United States Patent and Trademark Office*